(12) United States Patent
Cao et al.

(10) Patent No.: US 12,362,755 B2
(45) Date of Patent: Jul. 15, 2025

(54) CHIP STATE MONITORING CIRCUIT BASED ON SELF-BALANCING DIFFERENTIAL SIGNAL INTEGRATION AND AMPLIFICATION CIRCUIT

(71) Applicant: WUXI ESIONTECH CO., LTD., Wuxi (CN)

(72) Inventors: Zhengzhou Cao, Wuxi (CN); Feige Xia, Wuxi (CN); Yueer Shan, Wuxi (CN); Hua Yan, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 195 days.

(21) Appl. No.: 18/347,660

(22) Filed: Jul. 6, 2023

(65) Prior Publication Data

US 2023/0353161 A1    Nov. 2, 2023

Related U.S. Application Data

(63) Continuation of application No. PCT/CN2023/082992, filed on Mar. 22, 2023.

(30) Foreign Application Priority Data

Sep. 27, 2022 (CN) .......................... 202211180502.8

(51) Int. Cl.
*H03M 1/12* (2006.01)
*H03M 1/00* (2006.01)

(52) U.S. Cl.
CPC ......... *H03M 1/002* (2013.01); *H03M 1/1255* (2013.01)

(58) Field of Classification Search
CPC ...... H03M 3/458; H03M 3/34; H03M 1/1245; H03M 3/43; H03M 3/342; H03M 3/356;
(Continued)

(56) References Cited

U.S. PATENT DOCUMENTS 6,201,835 B1 * 3/2001 Wang ...................... H03M 3/34
375/247
8,604,861 B1 * 12/2013 Ceballos .................. G06G 7/18
327/337

(Continued)

FOREIGN PATENT DOCUMENTS

CN     103199806 A    7/2013
CN     104485135 A    4/2015
CN     115567018 A    1/2023

*Primary Examiner* — Linh V Nguyen
(74) *Attorney, Agent, or Firm* — Bayramoglu Law Offices LLC

(57) ABSTRACT

A chip state monitoring circuit based on a self-balancing differential signal integration and amplification circuit is provided. The chip state monitoring circuit is built in a chip, and can sense a state signal of the chip and transmit the state signal to a chip configuration circuit after performing amplification and analog-to-digital conversion, such that the chip configuration circuit can monitor a state and provide a timely feedback or response, thereby improving reliability and a service life of the chip. The chip state monitoring circuit uses a brand new self-balancing differential signal integration and amplification circuit. With a built-in positive coefficient integration network and negative coefficient balancing network, the self-balancing differential signal integration and amplification circuit can perform amplification by required times to enter a self-balancing stable state, thereby achieving fixed-multiple amplification without timed reading. The control method is simple and flexible.

8 Claims, 4 Drawing Sheets

(58) Field of Classification Search
CPC .... H03M 1/1009; H03M 3/424; H03M 3/456;
H03M 3/464; H03M 1/002; H03M 1/12;
H03M 1/1215; H03M 1/38; H03M 1/742;
H03M 3/322; H03M 3/438; H03M 3/454;
H03M 3/47; H03M 1/00; H03M 1/02;
H03M 1/0607; H03M 1/0612; H03M
1/0617; H03M 1/0626; H03M 1/0629;
H03M 1/0639; H03M 1/0665; H03M
1/068; H03M 1/0695; H03M 1/0836;
H03M 1/089; H03M 1/1019; H03M
1/1033; H03M 1/1042; H03M 1/1071;
H03M 1/128; H03M 1/144; H03M 1/145;
H03M 1/167; H03M 1/34; H03M 1/363;
H03M 1/40; H03M 1/44; H03M 1/445;
H03M 1/46; H03M 1/466; H03M 1/468;
H03M 1/66; H03M 1/68; H03M 1/72;
H03M 1/802; H03M 3/02; H03M 3/332;
H03M 3/35; H03M 3/368; H03M 3/372;
H03M 3/376; H03M 3/402; H03M 3/422;
H03M 3/496; H03F 3/005; H03F
2200/81; H03F 3/45475; H03F 1/26;
H03F 2200/261; H03F 2203/45514; H03F
2203/45614; H03F 3/38

USPC ................. 341/118–120, 143, 155, 172, 150
See application file for complete search history.

(56) References Cited

U.S. PATENT DOCUMENTS

| | | | | |
|---|---|---|---|---|
| 8,779,958 | B1* | 7/2014 | Maurino | H03M 3/35 |
| | | | | 341/144 |
| 8,841,962 | B1 | 9/2014 | Trampitsch | |
| 8,884,804 | B1* | 11/2014 | Majumdar | G04F 10/005 |
| | | | | 341/120 |
| 9,391,628 | B1* | 7/2016 | Lyden | H03M 1/1245 |
| 9,525,426 | B2* | 12/2016 | Stojanovic | H03M 3/458 |
| 2011/0279148 | A1 | 11/2011 | Watanabe | |
| 2012/0161994 | A1* | 6/2012 | Quiquempoix | H03F 3/005 |
| | | | | 330/69 |
| 2016/0022140 | A1* | 1/2016 | Colman | A61B 5/746 |
| | | | | 340/539.12 |
| 2017/0257113 | A1* | 9/2017 | Singh | G01K 7/01 |
| 2020/0162093 | A1 | 5/2020 | Nakamura et al. | |
| 2022/0100220 | A1* | 3/2022 | Mesgarani | G01K 7/01 |
| 2022/0268838 | A1* | 8/2022 | Sestok, IV | G01R 31/3167 |
| 2023/0421170 | A1* | 12/2023 | Wada | H03M 3/454 |

* cited by examiner

CHIP STATE MONITORING CIRCUIT BASED ON SELF-BALANCING DIFFERENTIAL SIGNAL INTEGRATION AND AMPLIFICATION CIRCUIT

CROSS REFERENCE TO THE RELATED APPLICATIONS

This application is the continuation application of International Application No. PCT/CN2023/082992, filed on Mar. 22, 2023, which is based upon and claims priority to Chinese Patent Application No. 202211180502.8, filed on Sep. 27, 2022, the entire contents of which are incorporated herein by reference.

TECHNICAL FIELD

The present disclosure relates to the technical field of chips, and in particular, to a chip state monitoring circuit based on a self-balancing differential signal integration and amplification circuit.

BACKGROUND

A static random access memory (SRAM)-type programmable logic device is designed based on a reconfigurable SRAM-type storage technology, and can achieve different functions for a user by configuring circuit logic. The SRAM-type programmable logic device is widely used in various fields and scenarios.

The SRAM-type programmable logic device is often applied to a field with a high reliability requirement. However, as more internal logic resources are used, higher computing speeds are required, and increased power consumptions are needed, the SRAM-type programmable logic device is prone to various operational faults in an operating process, making it difficult to guarantee the operational reliability.

SUMMARY

To resolve the above problems and meet the above technical requirements, the inventor proposes a chip state monitoring circuit based on a self-balancing differential signal integration and amplification circuit. The technical solutions of the present disclosure are as follows:

A chip state monitoring circuit based on a self-balancing differential signal integration and amplification circuit is provided, where the chip state monitoring circuit includes a state sensing circuit, a self-balancing differential signal integration and amplification circuit, and an analog-to-digital converter that are sequentially connected, the analog-to-digital converter is connected to a chip configuration circuit inside a chip, and the state sensing circuit is disposed at a to-be-detected point inside the chip to sense a differential-form state signal of the chip;

the self-balancing differential signal integration and amplification circuit includes a fully differential operational amplifier, a positive coefficient integration network, and a negative coefficient balancing network, where both the positive coefficient integration network and the negative coefficient balancing network are connected between an input terminal and an output terminal of the fully differential operational amplifier; the fully differential operational amplifier achieves a signal amplification function for the state signal under the action of the positive coefficient integration network, and performs reverse adjustment on signal amplification under the action of the negative coefficient balancing network; and a reverse adjustment function achieved by the negative coefficient balancing network is gradually enhanced until the self-balancing differential signal integration and amplification circuit achieves self balancing, such that an output signal of the self-balancing differential signal integration and amplification circuit is stabilized to a state signal amplified by K times; and the state signal amplified by the K times is output to the chip configuration circuit after undergoing analog-to-digital conversion by the analog-to-digital converter.

The present disclosure has following beneficial effects:

The present disclosure provides a chip state monitoring circuit based on a self-balancing differential signal integration and amplification circuit. The chip state monitoring circuit is built in a chip, and can monitor a state of the chip to provide a timely feedback or response, thereby improving reliability and a service life of the chip. The chip state monitoring circuit internally uses a brand new self-balancing differential signal integration and amplification circuit. Under mutual action of a built-in positive coefficient integration network and negative coefficient balancing network, the self-balancing differential signal integration and amplification circuit can perform amplification by required times to enter a self-balancing stable state, thereby achieving fixed-multiple amplification without timed reading. The control method is simple and flexible.

An amplification factor achieved by the self-balancing differential signal integration and amplification circuit in the stable state is related to capacitance values of a sampling capacitor and a balancing capacitor. Therefore, the amplification factor can be stabilized and amplified by adjusting a ratio of the sampling capacitance to the balancing capacitance, to achieve high adjustment accuracy of the amplification factor and a precise and flexible adjustment method.

The self-balancing differential signal integration and amplification circuit has a simple structure, does not require a complex peripheral circuit, and does not occupy too much chip area and chip resources. Therefore, the self-balancing differential signal integration and amplification circuit is suitable for chip scenarios.

DETAILED DESCRIPTION OF THE EMBODIMENTS

Specific implementations of the present disclosure will be further described with reference to the accompanying drawings.

Figure 1:
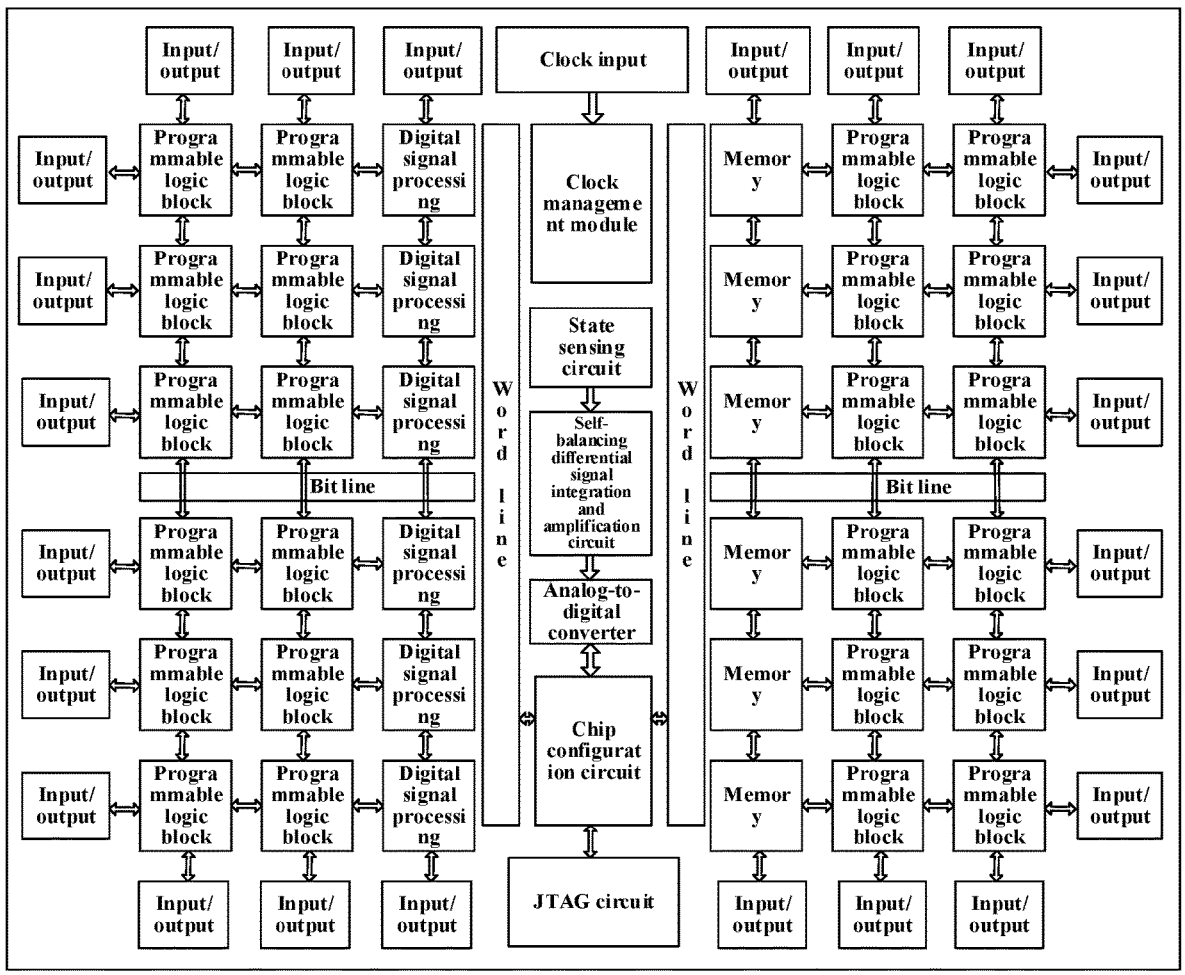
FIG. 1 schematically shows a circuit connection of a chip state monitoring circuit in a chip according to an embodiment of the present disclosure.

The present disclosure provides a chip state monitoring circuit based on a self-balancing differential signal integration and amplification circuit. A chip may be a field programmable gate array (FPGA) chip or an application specific integrated circuit (ASIC) chip, such as an SRAM-type FPGA. The chip state monitoring circuit includes a state sensing circuit, a self-balancing differential signal integration and amplification circuit, and an analog-to-digital converter that are sequentially connected. The analog-to-digital converter is connected to a chip configuration circuit inside the chip. Referring to a schematic diagram of an internal structure of the chip shown in FIG. 1, the chip state monitoring circuit may be added to an existing chip architecture to monitor an operating state of the chip, thereby ensuring operational reliability of the chip. It should be noted that FIG. 1 only schematically illustrates a connection relationship between the chip state monitoring circuit and the chip configuration circuit when the chip state monitoring circuit is disposed inside the chip, and does not represent an actual position and an occupied chip region of the chip state monitoring circuit inside the chip.

The state sensing circuit is disposed at a to-be-detected point inside the chip to sense a differential-form state signal of the chip. The self-balancing differential signal integration and amplification circuit amplifies the sensed state signal, and the amplified state signal is output to the chip configuration circuit after undergoing analog-to-digital conversion by the analog-to-digital converter. The chip configuration circuit can provide a timely feedback or response after receiving the state signal. The state sensing circuit may be any type of sensor, and the sensed state signal may be any important operating parameter of the chip.

For example, in a typical application, the chip is the SRAM-type FPGA, and the state sensing circuit is a temperature sensor. In this case, the sensed state signal is a temperature signal. In an operating process of the chip, excessively accumulated heat can easily cause a thermal breakdown or an electrical breakdown. Because the SRAM type-FPGA cannot save its own data after a power failure, it is of very important application value to monitor the temperature signal in an operating process of the SRAM-type FPGA. Subsequently, the chip configuration circuit can adjust an operating frequency of a dormant frequency in a timely manner to effectively provide high-temperature protection for the SRAM-type FPGA, thereby improving reliability and a service life of the chip. This is also true for other important operating parameters in addition to a temperature.

In the chip state monitoring circuit, the sensed state signal is generally a differential-form alternating current (AC) small signal. Therefore, it is necessary to use a differential signal integration and amplification circuit to amplify the state signal. A conventional differential signal integration and amplification circuit amplifies a differential signal based on a fixed cycle, and performs integration until a maximum output swing of the circuit is reached, and the amplified signal needs to be read regularly. This makes it difficult to perform control and adjust an amplification factor. Moreover, the conventional differential signal integration and amplification circuit has a complex peripheral circuit, which occupies a lot of chip resources and chip area, and makes it difficult to apply the conventional differential signal integration and amplification circuit to a scenario with a high integration requirement, such as the chip. Therefore, the chip state monitoring circuit in the present disclosure cannot directly use an existing common differential signal integration and amplification circuit.

In order to meet an internal usage requirement of the chip, the present disclosure uses a brand new self-balancing differential signal integration and amplification circuit. The self-balancing differential signal integration and amplification circuit includes a fully differential operational amplifier, a positive coefficient integration network, and a negative coefficient balancing network. Both the positive coefficient integration network and the negative coefficient balancing network are connected between an input terminal and an output terminal of the fully differential operational amplifier. The fully differential operational amplifier amplifies the state signal under the action of the positive coefficient integration network, and performs reverse adjustment on signal amplification under the action of the negative coefficient balancing network. The self-balancing differential signal integration and amplification circuit achieves an amplification function of the state signal as a whole, but a reverse adjustment function achieved by the negative coefficient balancing network is gradually enhanced until achieving self balancing with the amplification factor, such that an output signal of the self-balancing differential signal integration and amplification circuit finally reaches a stable state and outputs a state signal amplified by K times.

The signal amplification function of the positive coefficient integration network and the reverse adjustment function of the negative coefficient balancing network change according to a following method: The self-balancing differential signal integration and amplification circuit further includes a sampling network. The sampling network samples a charge of the state signal, and the charge sampled by the sampling network is transferred to the positive coefficient integration network and the negative coefficient balancing network.

Before the self-balancing differential signal integration and amplification circuit achieves self balancing, one part of the charge sampled by the sampling network is transferred to the positive coefficient integration network to achieve the signal amplification function, and the other part of the charge sampled by the sampling network is transferred to the negative coefficient balancing network to achieve the reverse adjustment function of the signal amplification. An overall signal amplification effect is better than a reverse adjustment effect, so the output signal of the self-balancing differential signal integration and amplification circuit gradually increases. As an output signal of the fully differential operational amplifier increases, the charge transferred by the sampling network to the negative coefficient balancing network increases, such that the reverse adjustment function achieved by the negative coefficient balancing network is gradually enhanced.

After the self-balancing differential signal integration and amplification circuit achieves self balancing, the charge sampled by the sampling network is completely transferred to the negative coefficient balancing network, such that the output signal of the self-balancing differential signal integration and amplification circuit is stabilized to the state signal amplified by the K times.

Actually, the self-balancing differential signal integration and amplification circuit works based on a cycle and the output signal increases gradually. In each sampling cycle, the self-balancing differential signal integration and amplification circuit increases its output signal through a sampling stage, an integration stage, and a holding stage in sequence, and finally the output signal becomes stable after a plurality of sampling cycles. A working process of the self-balancing differential signal integration and amplification circuit is as follows:

In each sampling cycle before the self-balancing differential signal integration and amplification circuit achieves self balancing: (1) In the sampling stage, the sampling network samples the charge of the state signal. (2) In the integration stage, the fully differential operational amplifier starts working, and the sampling network transfers the sampled charge to the positive coefficient integration network and the negative coefficient balancing network according to the process described above, to increase the output signal of the self-balancing differential signal integration and amplification circuit. (3) In the holding stage, the output signal of the fully differential operational amplifier remains unchanged.

As the sampling cycle progresses, the charge transferred by the sampling network to the integration network and the charge transferred by the sampling network to the balancing network are not fixed in integration stages of different sampling cycles. The charge transferred by the sampling network to the negative coefficient balancing network increases as the output signal of the fully differential operational amplifier increases. Therefore, the reverse adjustment function achieved by the negative coefficient balancing network is gradually enhanced with the sampling cycle, until a balance between the reverse adjustment function achieved by the negative coefficient balancing network and the amplification function achieved by the positive coefficient integration network is finally achieved. In this way, after a plurality of sampling cycles, the self-balancing differential signal integration and amplification circuit achieves self balancing. In each sampling cycle after the self-balancing differential signal integration and amplification circuit achieves self balancing: (1) In the sampling stage, the sampling network also samples the charge of the state signal. (2) In the integration stage, the fully differential operational amplifier starts working, and the sampling network completely transfers the sampled charge to the negative coefficient balancing network to keep the output signal of the self-balancing differential signal integration and amplification circuit unchanged. (3) In the holding stage, the output signal of the fully differential operational amplifier remains unchanged.

Figure 2:
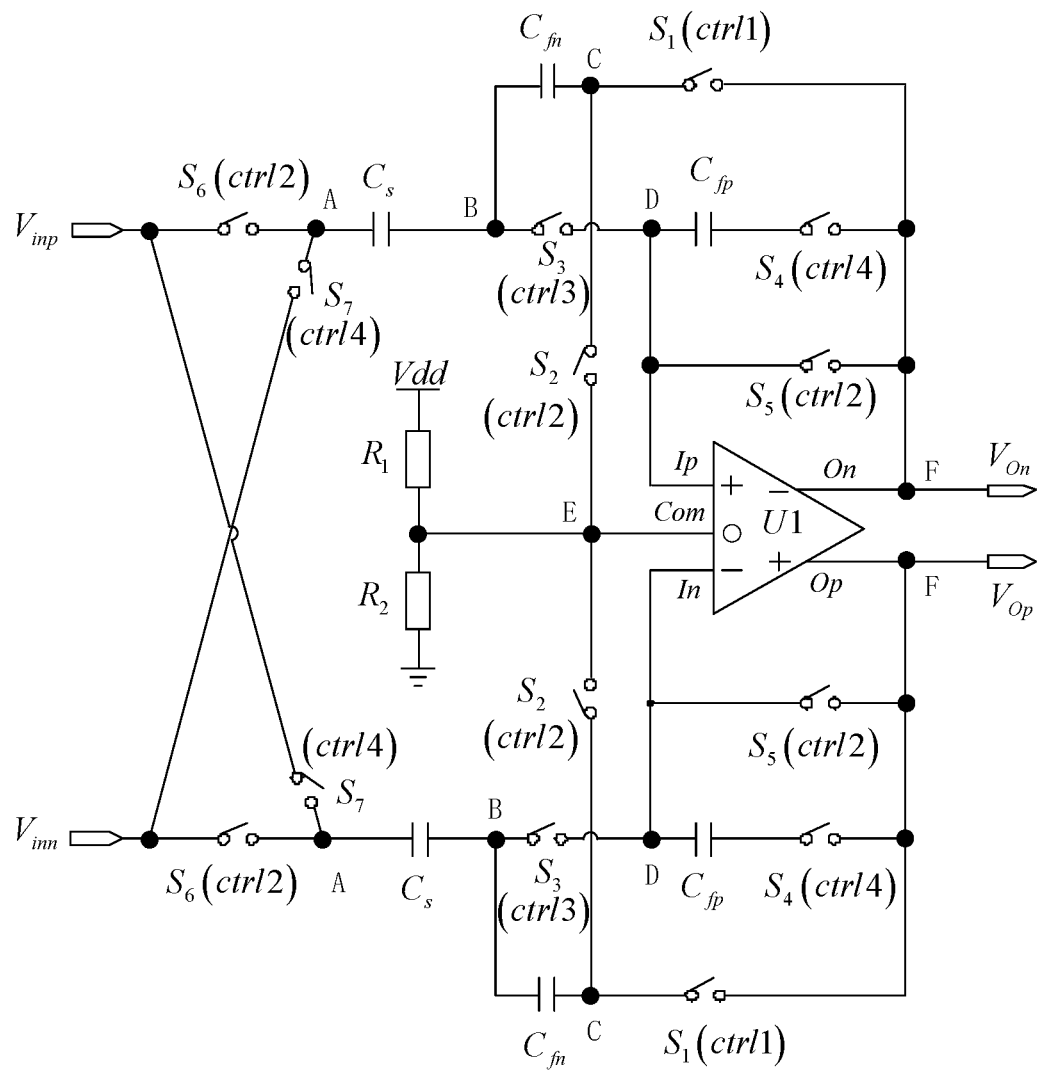
FIG. 2 is a circuit diagram of a self-balancing differential signal integration and amplification circuit in a chip state monitoring circuit according to an embodiment of the present disclosure.

The sampling network is built based on sampling capacitor $C_s$, the positive coefficient integration network is built based on integration capacitor $C_{fp}$, and the negative coefficient balancing network is built based on balancing capacitor $C_{fn}$. FIG. 2 is a circuit diagram of the self-balancing differential signal integration and amplification circuit according to an embodiment. As shown in FIG. 2, the self-balancing differential signal integration and amplification circuit has a simple circuit structure and does not require a complex peripheral circuit. The self-balancing differential signal integration and amplification circuit further includes a common-mode signal generation circuit. The common-mode signal generation circuit is connected to common-mode signal terminal Com of the fully differential operational amplifier U1 to provide voltage $V_{com}$. In an embodiment, the common-mode signal generation circuit is implemented by a voltage division circuit composed of resistor $R_1$ and resistor $R_2$.

A first circuit structure is connected between positive input terminal Ip and negative output terminal On of the fully differential operational amplifier U1, and a second circuit structure is connected between negative input terminal In and positive output terminal Op of the fully differential operational amplifier U1. The first circuit structure is symmetrical with the second circuit structure, and their working processes are the same. Each circuit structure includes the sampling network, the positive coefficient integration network, and the negative coefficient balancing network.

In each sampling cycle of the self-balancing differential signal integration and amplification circuit: (1) In the sampling stage, the sampling network in the first circuit structure is connected to positive differential input terminal $V_{inp}$ of the self-balancing differential signal integration and amplification circuit for sampling, and the sampling network in the second circuit structure is connected to negative differential input terminal $V_{inn}$ of the self-balancing differential signal integration and amplification circuit for sampling. (2) In the integration stage, the sampling network in the first circuit structure is connected to the negative differential input terminal $V_{inn}$ of the self-balancing differential signal integration and amplification circuit, and the sampling network in the second circuit structure is connected to the positive differential input terminal $V_{inp}$ of the self-balancing differential signal integration and amplification circuit. Therefore, a changing voltage difference on the sampling capacitor in each sampling network enables the sampled charge to be transferred to the positive coefficient integration network and the negative coefficient balancing network in a corresponding circuit structure of the sampling network.

Referring to FIG. 2, in the first circuit structure, an upper plate of the sampling capacitor $C_s$ in the sampling network is connected to the positive differential input terminal $V_{inp}$ of the self-balancing differential signal integration and amplification circuit through switch $S_6$, and the upper plate of the sampling capacitor $C_s$ is further connected to the negative differential input terminal $V_{inn}$ of the self-balancing differential signal integration and amplification circuit through switch $S_7$. A lower plate of the sampling capacitor $C_s$ is connected to a lower plate of the balancing capacitor $C_{fn}$ in the negative coefficient balancing network, and an upper plate of the balancing capacitor $C_{fn}$ is connected to the negative output terminal On of the fully differential operational amplifier through switch $S_1$. The upper plate of the balancing capacitor $C_{fn}$ is further connected to the common-mode signal terminal Com of the fully differential operational amplifier through switch $S_2$. The lower plate of the sampling capacitor $C_s$ is further connected to a lower plate of the integration capacitor $C_{fp}$ in the positive coefficient integration network through switch $S_3$, and an upper plate of the integration capacitor $C_{fp}$ is connected to the negative output terminal On of the fully differential operational amplifier through switch $S_4$. The lower plate of the integration capacitor $C_{fp}$ is further connected to the positive input terminal IP of the fully differential operational amplifier, and the positive input terminal IP and the negative output terminal On of the fully differential operational amplifier are bridged through switch $S_5$.

The second circuit structure is symmetrical with the first circuit structure, and same reference numerals are used in FIG. 2. In the second circuit structure, the upper plate of the sampling capacitor $C_s$ in the sampling network is connected to the negative differential input terminal $V_{inn}$ through switch $S_6$ and the upper plate of the sampling capacitor $C_s$ is further connected to the positive differential input terminal $V_{inp}$ through switch $S_7$. The lower plate of the sampling capacitor $C_s$ is connected to the lower plate of the balancing capacitor $C_{fn}$ in the negative coefficient balancing network, and the upper plate of the balancing capacitor $C_{fn}$ is connected to the positive output terminal Op of the fully differential operational amplifier through switch $S_1$. The upper plate of the balancing capacitor $C_{fn}$ is further connected to the common-mode signal terminal Com of the fully differential operational amplifier through switch $S_2$. The lower plate of the sampling capacitor $C_s$ is further connected to the lower plate of the integration capacitor $C_{fp}$ in the positive coefficient integration network through switch $S_3$, and the upper plate of the integration capacitor $C_{fp}$ is connected to the positive output terminal Op of the fully differential operational amplifier through switch $S_4$. The lower plate of the integration capacitor $C_{fp}$ is further connected to the negative input terminal In of the fully differential operational amplifier, and the positive input terminal IP and the negative output terminal On of the fully differential operational amplifier are bridged through the switch $S_5$.

In the two circuit structures, the switch $S_1$ is controlled by control signal ctrl1, the switch $S_2$, the switch $S_5$, and the switch $S_6$ are all controlled by control signal ctrl2, the switch $S_3$ is controlled by control signal ctrl3, and the switch $S_4$ and the switch $S_7$ are controlled by control signal ctrl4.

Figure 3:
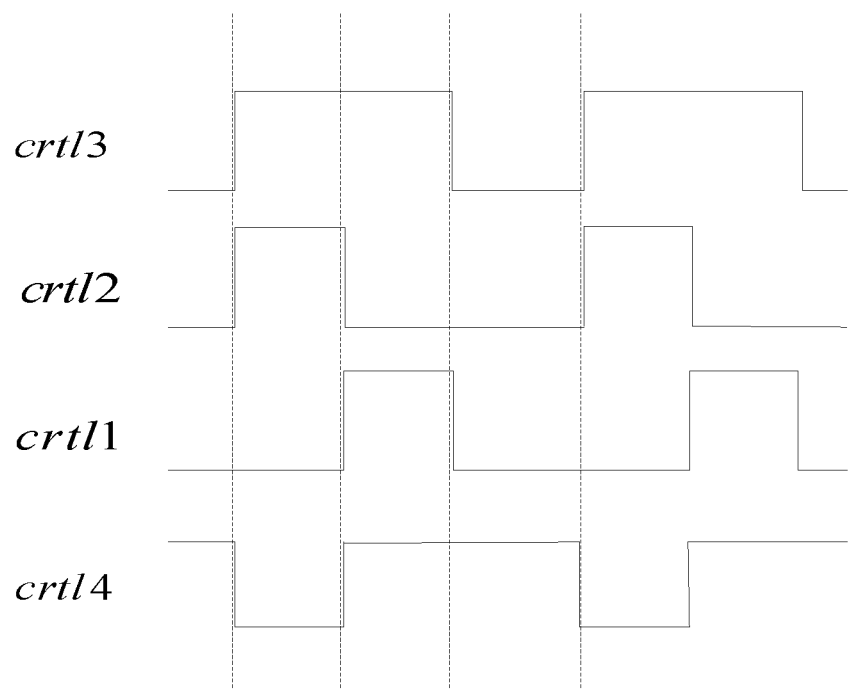
FIG. 3 is a sequence chart of controlling a corresponding switch by each control signal in FIG. 2.

Based on the circuit diagram shown in FIG. 2, referring to a sequence chart of controlling a corresponding switch by each control signal in FIG. 3, as well as a voltage change value shown in FIG. 4, the working process of the self-balancing differential signal integration and amplification circuit is as follows. Because the first circuit structure and the second circuit structure are symmetrical and have the same working process, the working process of the first circuit structure in each sampling cycle is described as follows:

(1) In the sampling stage, the control signal ctrl2 controls the switch $S_2$, the switch $S_5$, and the switch $S_6$ to be closed, the control signal ctrl3 controls the switch $S_3$ to be closed, the control signal ctrl1 controls the switch $S_1$ to be opened, and the control signal ctrl4 controls the switch $S_4$ and the switch $S_7$ to be opened.

Because the switch $S_5$ is closed, the positive input terminal IP and the negative output terminal On of the fully differential operational amplifier U1 are short circuited, and the negative input terminal In and the positive output terminal Op of the fully differential operational amplifier are short circuited. A value generated after the short circuit is connected to the lower plate of the sampling capacitor $C_s$ through path F→D→B, and is also connected to the lower plate of the balancing capacitor $C_{fn}$.

Because the switch $S_6$ is closed and the switch $S_7$ is opened, the upper plate of the sampling capacitor $C_s$ in the first circuit structure is connected to the positive differential input terminal $V_{inp}$. Therefore, a charge sampled by the sampling capacitor $C_s$ is calculated according to formula $Q_s^s=(V_{com}-V_{inp})*C_s$, where $C_s$ represents a capacitance value of the sampling capacitor $C_s$.

The upper plate of the balancing capacitor $C_{fn}$ is connected to an output terminal of the common-mode signal generation circuit, and the voltage is $V_{com}$. Therefore, a charge in the balancing capacitor $C_{fn}$ calculated according to formula $Q_{fn}^s=(V_{com}-V_{Ip})*C_{fn}$, where $V_{Ip}$ represents a voltage of the positive input terminal Ip of the fully differential operational amplifier, and $C_{fn}$ represents a capacitance value of the balancing capacitor $C_{fn}$. Because the positive input terminal Ip and the negative output terminal On are short circuited $V_{com}=V_{Ip}=V_{On}$. Therefore, $Q_{fn}^s=(V_{com}-V_{Ip})*C_{fn}=0$. $V_{Ip}$ represents the voltage of the positive input terminal Ip of the fully differential operational amplifier, and $V_{on}$ represents a voltage of the negative output terminal On of the fully differential operational amplifier.

Because the switch $S_1$ and the switch $S_4$ are opened, a charge in the integration capacitor $C_{fp}$ remains unchanged, which is equal to a charge in a previous sampling cycle.

(2) In the integration stage, the control signal ctrl2 controls the switch $S_2$, the switch $S_5$, and the switch $S_6$ to be opened, the control signal ctrl3 controls the switch $S_3$ to be closed, the control signal ctrl1 controls the switch $S_1$ to be closed, and the control signal ctrl4 controls the switch $S_4$ and the switch $S_7$ to be closed.

Because the switch $S_5$ is opened, the fully differential operational amplifier starts working, and the upper plate of the sampling capacitor $C_s$ in the first circuit structure switches to the negative differential input terminal $V_{inn}$. In this case, the charge sampled by the sampling capacitor $C_s$ is calculated according to formula $Q_s^i=(V_{com}-V_{inn})*C_s$, where $V_{inn}$ represents a voltage of the negative differential input terminal $V_{inn}$. During switching from the sampling stage to the integration stage, the changing voltage difference on the sampling capacitor $C_s$ enables the charge sampled by the sampling capacitor $C_s$ to be transferred to the balancing capacitor $C_{fn}$ and the integration capacitor $C_{fp}$, with the transferred charge being $\Delta Q_s = Q_s^s - Q_s^i = (V_{inn}-V_{inp})*C_s$.

The lower plate of the sampling capacitor $C_s$, the lower plate of the balancing capacitor $C_{fn}$, and the lower plate of the integration capacitor $C_{fp}$ are connected and are connected to the positive input terminal Ip of the fully differential operational amplifier. The upper plate of the balancing capacitor $C_{fn}$ and the upper plate of the integration capacitor $C_{fp}$ are connected and are connected to the negative output terminal On of the fully differential operational amplifier.

Therefore, in this case, the charge in the balancing capacitor $C_{fn}$ is calculated according to formula $Q_{fn}^i=(V_{Ip}-V_{On})*C_{fn}$. Since the charge change in the balancing capacitor $C_{fn}$ is caused by the charge transfer by the sampling capacitor $C_s$, it can be determined that the charge transferred by the sampling capacitor $C_s$ to the balancing capacitor $C_{fn}$ of the negative coefficient balancing network is calculated according to formula $\Delta Q_{fn}=Q_{fn}^s-Q_{fn}^i=(V_{On}-V_{Ip})*C_{fn}$.

Further, it can be determined that the charge transferred by the sampling capacitor $C_s$ to the integration capacitor $C_{fp}$ of the positive coefficient integration network is calculated according to $\Delta Q_{fp}=\Delta Q_s-\Delta Q_{fn}=(V_{inn}-V_{inp})*C_s-(V_{On}-V_{Ip})*C_{fn}$.

(3) In the holding stage, the control signal ctrl2 controls the switch $S_2$, the switch $S_5$, and the switch $S_6$ to be opened, the control signal ctrl3 controls the switch $S_3$ to be opened, the control signal ctrl1 controls the switch $S_1$ to be opened, and the control signal ctrl4 controls the switch $S_4$ and the switch $S_7$ to be closed. Two terminals of the integration capacitor $C_{fp}$ are respectively connected to the input terminal and the output terminal of the fully differential operational amplifier. The fully differential operational amplifier keeps the output signal unchanged, and the charge of the integration capacitor remains $C_{fp}$ unchanged until a next sampling cycle.

Based on the working process described above, it can be determined that in each sampling cycle when $\Delta Q_s$ and $\Delta Q_{fn}$ are unequal, in other words, before the self-balancing differential signal integration and amplification circuit achieves self balancing, after the switching to the integration stage, the sampling capacitor $C_s$ transfers the charge to the positive coefficient integration network and the negative coefficient balancing network, and charges respectively transferred to the positive coefficient integration network and the negative coefficient balancing network are as described above. In addition, as the sampling cycle changes, output signals $V_{On}$ and $V_{Op}$ of the fully differential operational amplifier increase, such that the charge $\Delta Q_{fn}$ transferred by the sampling capacitor $C_s$ to the balancing capacitor $C_{fn}$ in the sampling stage increases, and the reverse adjustment function achieved by the negative coefficient balancing network is enhanced.

After a plurality of sampling cycles, when $\Delta Q_{fn}$ increases to be equal to $\Delta Q_s$, the self-balancing differential signal integration and amplification circuit achieves self balancing. Afterwards, in each sampling cycle, the charge $\Delta Q_s$ transferred by the sampling capacitor $C_s$ to the positive coefficient integration network and the negative coefficient balancing network is completely transferred to the balancing capacitor $C_{fn}$, rather than to the integration capacitor $C_{fp}$, such that the output signal of the self-balancing differential signal integration and amplification circuit is stabilized to the state signal amplified by the K times. As shown in FIG. 4, if a voltage of the state signal obtained from the differential input terminal is set to $V_{inp}-V_{inn}=\Delta V$, the output signal of the self-balancing differential signal integration and amplification circuit gradually increases with the sampling cycle until it is finally stabilized at $V_{Op}-V_{On}=K\times\Delta V$. Then, as the sampling cycle changes, the output signal of the self-balancing differential signal integration and amplification circuit no longer changes, achieving a stable output effect.

Figure 4:
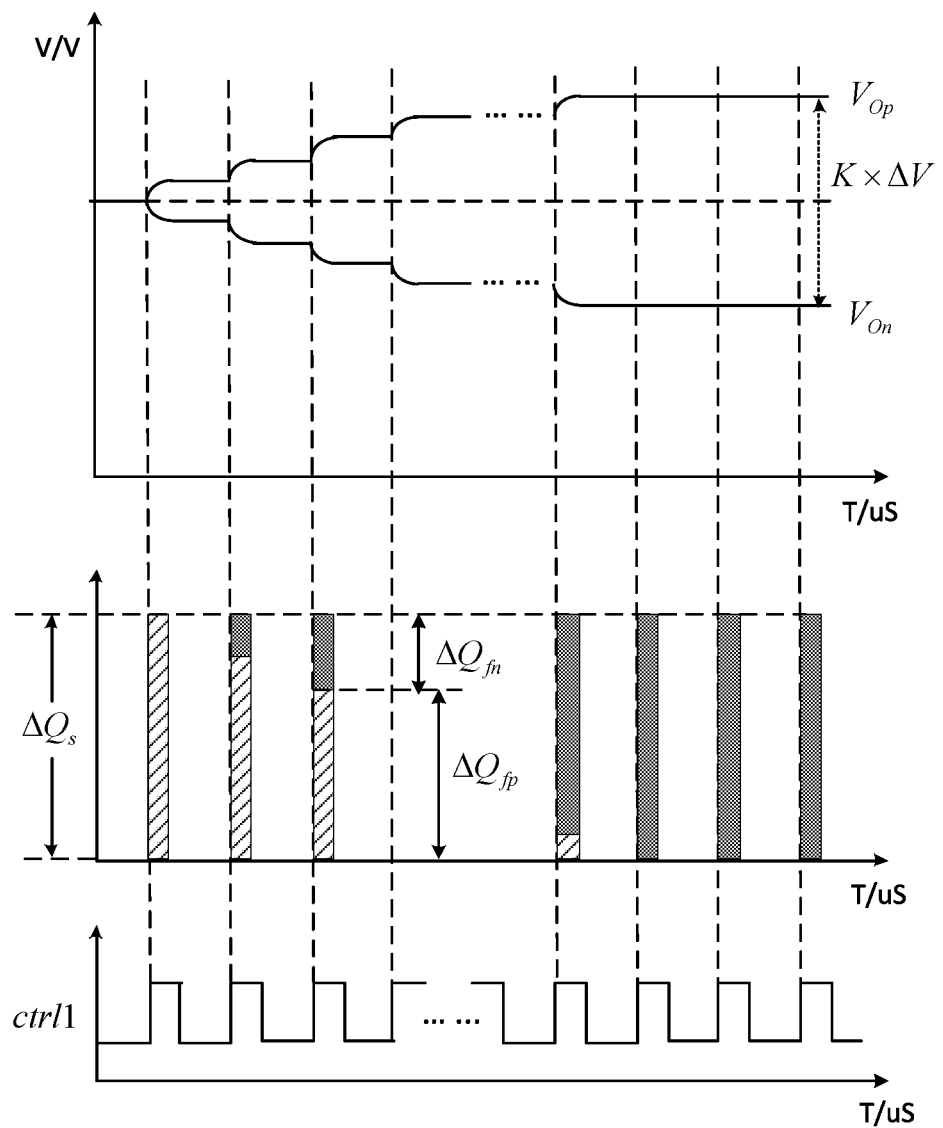
FIG. 4 shows a voltage change of an output signal of a self-balancing differential signal integration and amplification circuit, as well as changes of quantities of charges transferred by a sampling capacitor to two networks with respect to a sampling cycle according to the present disclosure.

FIG. 4 shows changes of quantities of charges $\Delta Q_s$ transferred by the sampling capacitor $C_s$ to the positive coefficient integration network and the negative coefficient balancing network with respect to the sampling cycle. It can be seen from FIG. 4 that as a quantity of sampling cycles increases, the charge $\Delta Q_{fp}$ transferred by the sampling capacitor $C_s$ to the integration capacitor $C_{fp}$ gradually decreases, and the charge $\Delta Q_{fn}$ transferred by the sampling capacitor $C_s$ to the balancing capacitor $C_{fn}$ gradually increases to be equal to $\Delta Q_{fn}$. In a subsequent sampling cycle, the charge $\Delta Q_{fn}$ transferred to the balancing capacitor $C_{fn}$ of the negative coefficient balancing network is always $\Delta Q_s$, and the charge $\Delta Q_{fp}$ transferred to the integration capacitor $C_{fp}$ is always 0.

The amplification factor K achieved for the state signal by the self-balancing differential signal integration and amplification circuit in the stable state is determined by the capacitance value of the sampling capacitor $C_s$ and the capacitance value of the balancing capacitor $CC_{fn}$. Referring to FIG. 2, it is assumed that $C_s=M\times C_{fn}$, where $C_s$ represents the capacitance value of the sampling capacitor $C_s$, $C_{fn}$ represents the capacitance value of the balancing capacitor $C_{fn}$, and M represents a positive coefficient. It can be inferred and determined that $V_{on}=V_{com}-M*(V_{inp}-V_{inn})$ and $V_{op}=V_{com}+M*(V_{inp}-V_{inn})$. Therefore, the amplification factor $$K = \frac{V_{op}-V_{on}}{V_{inp}-V_{inn}} = 2M = 2\times\frac{C_s}{C_{fn}}$$

achieved when the self-balancing differential signal integration and amplification circuit reaches the stable state can be obtained. Therefore, the amplification factor K can be accurately adjusted by adjusting a ratio of the sampling capacitance $C_s$ to the balancing capacitance $C_{fn}$.

The above described are merely preferred implementations of the present disclosure, and the present disclosure is not limited to the above embodiments. It can be understood that other improvements and modifications directly derived or associated by those skilled in the art without departing from the spirit and concept of the present disclosure should be regarded as falling within the protection scope of the present disclosure.

What is claimed is:

1. Chip state monitoring circuit based on a self-balancing differential signal integration and amplification circuit, comprising a state sensing circuit, a self-balancing differential signal integration and amplification circuit, and an analog-to-digital converter, wherein the state sensing circuit, a self-balancing differential signal integration and amplification circuit, and an analog-to-digital converter are sequentially connected;

the analog-to-digital converter is connected to a chip configuration circuit inside a chip, and the state sensing circuit is disposed at a to-be-detected point inside the chip to sense a differential-form state signal of the chip;

the self-balancing differential signal integration and amplification circuit comprises a fully differential operational amplifier, a positive coefficient integration network, and a negative coefficient balancing network, wherein both the positive coefficient integration network and the negative coefficient balancing network are connected between an input terminal and an output terminal of the fully differential operational amplifier;

the fully differential operational amplifier achieves a signal amplification function for the differential-form state signal under an action of the positive coefficient integration network, and performs reverse adjustment on signal amplification under an action of the negative coefficient balancing network;

a reverse adjustment function achieved by the negative coefficient balancing network is gradually enhanced until the self-balancing differential signal integration and amplification circuit achieves self balancing, to stabilize an output signal of the self-balancing differential signal integration and amplification circuit to a state signal amplified by K times; and the state signal amplified by the K times is output to the chip configuration circuit after undergoing analog-to-digital conversion by the analog-to-digital converter, wherein the self-balancing differential signal integration and amplification circuit further comprises a sampling network for sampling a charge of a state signal;

before the self-balancing differential signal integration and amplification circuit achieves self balancing, a first part of the charge sampled by the sampling network is transferred to the positive coefficient integration network to achieve the signal amplification function, and a second part of the charge sampled by the sampling network is transferred to the negative coefficient balancing network to achieve the reverse adjustment function of the signal amplification, and the output signal of the self-balancing differential signal integration and amplification circuit gradually increases; and as an output signal of the fully differential operational amplifier increases, the second part of the charge transferred by the sampling network to the negative coefficient balancing network gradually increases, thereby gradually enhancing the reverse adjustment function achieved by the negative coefficient balancing network; and after the self-balancing differential signal integration and amplification circuit achieves self balancing, the charge sampled by the sampling network is completely transferred to the negative coefficient balancing network, and the output signal of the self-balancing differential signal integration and amplification circuit is stabilized to the state signal amplified by the K times, wherein in each sampling cycle, the self-balancing differential signal integration and amplification circuit successively undergoes a sampling stage, an integration stage, and a holding stage;

in each sampling cycle before the self-balancing differential signal integration and amplification circuit achieves self balancing: in the sampling stage, the sampling network samples the charge of the state signal; in the integration stage, the charge sampled by the sampling network is transferred to the positive coefficient integration network and the negative coefficient balancing network, to increase the output signal of the self-balancing differential signal integration and amplification circuit; and in the holding stage, the output signal of the fully differential operational amplifier remains unchanged; and in each sampling cycle after the self-balancing differential signal integration and amplification circuit achieves self balancing after a plurality of sampling cycles: in the sampling stage, the sampling network samples the charge of the state signal; in the integration stage, the charge sampled by the sampling network is completely transferred to the negative coefficient balancing network, to keep the output signal of the self-balancing differential signal integration and amplification circuit unchanged; and in the holding stage, the output signal of the fully differential operational amplifier remains unchanged.

2. The chip state monitoring circuit according to claim 1, wherein the positive coefficient integration network is built based on an integration capacitor $C_{fp}$, the negative coefficient balancing network is built based on a balancing capacitor $C_{fn}$, the sampling network is built based on a sampling capacitor $C_s$, and an amplification factor K achieved for the state signal by the self-balancing differential signal integration and amplification circuit in a stable state is determined by capacitance values of the sampling capacitor $C_s$ and the balancing capacitor $C_{fn}$.

3. The chip state monitoring circuit according to claim 2, wherein the amplification factor achieved for the state signal by the self-balancing differential signal integration and amplification circuit in the stable state is calculated according to a following formula:

$$K = 2 \times \frac{C_s}{C_{fn}},$$

wherein $C_s$ represents the capacitance value of the sampling capacitor $C_s$, and $C_{fn}$ represents the capacitance value of the balancing capacitor $C_{fn}$.

4. The chip state monitoring circuit according to claim 1, wherein in the integration stage of each sampling cycle before the self-balancing differential signal integration and amplification circuit achieves self balancing, the fully differential operational amplifier starts working, a charge sampled by a sampling capacitor is transferred to the positive coefficient integration network and the negative coefficient balancing network, and the charge transferred to the negative coefficient balancing network increases as the output signal of the fully differential operational amplifier increases, to gradually enhance the reverse adjustment function achieved by the negative coefficient balancing network.

5. The chip state monitoring circuit according to claim 1, wherein the self-balancing differential signal integration and amplification circuit further comprises a common-mode signal generation circuit connected to a common-mode signal terminal Com of the fully differential operational amplifier;

a first circuit structure is connected between a positive input terminal Ip and a negative output terminal On of the fully differential operational amplifier, a second circuit structure is connected between a negative input terminal In and a positive output terminal Op of the fully differential operational amplifier, and the first circuit structure is symmetrical with the second circuit structure; and each circuit structure comprises the sampling network, the positive coefficient integration network, and the negative coefficient balancing network; and in each sampling cycle of the self-balancing differential signal integration and amplification circuit, in the sampling stage, the sampling network in the first circuit structure is connected to a positive differential input terminal $V_{inp}$ of the self-balancing differential signal integration and amplification circuit for sampling, and the sampling network in the second circuit structure is connected to a negative differential input terminal $V_{inn}$ of the self-balancing differential signal integration and amplification circuit for sampling; in the integration stage, the sampling network in the first circuit structure is connected to the negative differential input terminal $V_{inn}$ of the self-balancing differential signal integration and amplification circuit, and the sampling network in the second circuit structure is connected to the positive differential input terminal $V_{inp}$ of the self-balancing differential signal integration and amplification circuit; and a changing voltage difference on the sampling capacitor in each of the two sampling networks enables the sampled charge to be transferred to an integration capacitor $C_{fp}$ in the positive coefficient integration network and a balancing capacitor $C_{fn}$ in the negative coefficient balancing network in the corresponding circuit structure of the sampling network.

6. The chip state monitoring circuit according to claim 5, wherein the first circuit structure comprises:

an upper plate of the sampling capacitor $C_s$ in the sampling network is connected to the positive differential input terminal $V_{inp}$ of the self-balancing differential signal integration and amplification circuit through a switch $S_6$, the upper plate of the sampling capacitor $C_s$ is further connected to the negative differential input terminal $V_{inn}$ of the self-balancing differential signal integration and amplification circuit through a switch $S_7$, a lower plate of the sampling capacitor $C_s$ is connected to a lower plate of the balancing capacitor $C_{fn}$ in the negative coefficient balancing network, an upper plate of the balancing capacitor $C_{fn}$ is connected to the negative output terminal On of the fully differential operational amplifier through a switch $S_1$, the upper plate of the balancing capacitor $C_{fn}$ is further connected to the common-mode signal terminal Com of the fully differential operational amplifier through a switch $S_2$, the lower plate of the sampling capacitor $C_s$ is further connected to a lower plate of the integration capacitor $C_{fp}$ in the positive coefficient integration network through a switch $S_3$, an upper plate of the integration capacitor $C_{fp}$ is connected to the negative output terminal On of the fully differential operational amplifier through a switch $S_4$, the lower plate of the integration capacitor $C_{fp}$ is further connected to the positive input terminal Ip of the fully differential operational amplifier, and the positive input terminal Ip and the negative output terminal On of the fully differential operational amplifier are also bridged through a switch $S_5$, wherein the switch $S_1$ is controlled by a control signal ctrl1, the switch $S_2$, the switch $S_5$, and the switch $S_6$ are all controlled by a control signal ctrl2, the switch $S_3$ is controlled by a control signal ctrl3, and the switch $S_4$ and the switch $S_7$ are controlled by a control signal ctrl4.

7. The chip state monitoring circuit according to claim 6, wherein a working process of the first circuit structure in each sampling cycle is as follows:

in the sampling stage, the control signal ctrl2 controls the switch $S_2$, the switch $S_5$ and the switch $S_6$ to be closed, the control signal ctrl3 controls the switch $S_3$ to be closed, the control signal ctrl1 controls the switch $S_1$ to be opened, and the control signal ctrl4 controls the switch $S_4$ and the switch $S_7$ to be opened; the upper plate of the sampling capacitor $C_s$ in the first circuit structure is connected to the positive differential input terminal $V_{inp}$, the positive input terminal Ip and the negative output terminal On of the fully differential operational amplifier are short circuited, a value obtained after the short circuit is connected to the lower plate of the sampling capacitor $C_s$ and the lower plate of the balancing capacitor $C_{fn}$, and the upper plate of the balancing capacitor $C_{fn}$ is connected to an output terminal of the common-mode signal generation circuit; and a charge in the integration capacitor $C_{fp}$ remains unchanged;

in the integration stage, the control signal ctrl2 controls the switch $S_2$, the switch $S_5$ and the switch $S_6$ to be opened, the control signal ctrl3 controls the switch $S_3$ to be closed, the control signal ctrl1 controls the switch $S_1$ to be closed, and the control signal ctrl4 controls the switch $S_4$ and the switch $S_7$ to be closed; the fully differential operational amplifier starts switch working; the upper plate of the sampling capacitor $C_s$ in the first circuit structure is connected to the negative differential input terminal $V_{inn}$, and the lower plate of the sampling capacitor $C_s$, the lower plate of the balancing capacitor $C_{fn}$, and the lower plate of the integration capacitor $C_{fp}$ are connected and are connected to the positive input terminal Ip of the fully differential operational amplifier; the upper plate of the balancing capacitor $C_{fn}$ and the upper plate of the integration capacitor $C_{fp}$ are connected and are connected to the negative output terminal On of the fully differential operational amplifier; and a changing voltage difference on the sampling capacitor $C_s$ enables the sampled charge to be transferred to the balancing capacitor $C_{fn}$ and the integration capacitor $C_{fp}$; and in the holding stage, the control signal ctrl2 controls the switch $S_2$, the switch $S_5$, and the switch $S_6$ to be opened, the control signal ctrl3 controls the switch $S_3$ to be opened, the control signal ctrl1 controls the switch $S_1$ to be opened, and the control signal ctrl4 controls the switch $S_4$ and the switch $S_7$ to be closed; two terminals of the integration capacitor $C_{fp}$ are respectively connected to the positive input terminal Ip and the negative output terminal On of the fully differential operational amplifier; and the fully differential operational amplifier maintains the output signal unchanged.

8. The chip state monitoring circuit according to claim 7, wherein in the working process of the first circuit structure in each sampling cycle, a change of the sampled charge is as follows:

in the sampling stage, a charge sampled by the sampling capacitor $C_s$ is calculated according to a formula $Q_s^s=(V_{com}-V_{inp})*C_s$, a charge in the balancing capacitor $C_{fn}$ is calculated according to a formula $Q_{fn}^s=(V_{com}-V_{Ip})*C_{fn}$, and the charge in the integration capacitor $C_{fp}$ is the same as that in a previous sampling cycle;

in the integration stage, the charge sampled by the sampling capacitor $C_s$ is calculated according to a formula $Q_s^i=(V_{com}-V_{inn})*C_s$, and the charge in the balancing capacitor $C_{fn}$ is calculated according to a formula $Q_s^i=(V_{Ip}-V_{On})*C_{fn}$;

during switching from the sampling stage to the integration stage, a charge transferred by the sampling capacitor $C_s$ to the positive coefficient integration network and the negative coefficient balancing network due to the changing voltage difference on the sampling capacitor $C_s$ is calculated according to a formula $\Delta Q_s=Q_s^s-Q_s^i=(V_{inn}-V_{inp})*C_s$;

in the holding stage, the charge in the integration capacitor $C_{fp}$ remains unchanged until a next sampling cycle;

in each sampling cycle before the self-balancing differential signal integration and amplification circuit achieves self balancing, after the switching to the integration stage, a charge transferred by the sampling capacitor $C_s$ to the balancing capacitor $C_{fn}$ of the negative coefficient balancing network is calculated according to a formula $\Delta Q_{fn}=Q_{fn}^s-Q_{fn}^i=(V_{On}-V_{Ip})*C_{fn}$, and a charge transferred to the integration capacitor $C_{fp}$ of the positive coefficient integration network is calculated according to a formula $\Delta Q_{fp}=\Delta Q_s-\Delta Q_{fn}=(V_{inn}-V_{inp})*C_s-(V_{On}-V_{Ip})*C_{fn}$;

as the sampling cycle changes, output signals $V_{On}$ and $V_{Op}$ of the fully differential operational amplifier increase, the charge $\Delta Q_{fn}$ transferred by the sampling capacitor $C_s$ to the balancing capacitor $C_{fn}$ increases, and the reverse adjustment function achieved by the negative coefficient balancing network is gradually enhanced; and after a plurality of sampling cycles, when $\Delta Q_s$ is equal to $\Delta Q_{fn}$, the self-balancing differential signal integration and amplification circuit achieves self balancing; and afterwards, in each sampling cycle after the self-balancing differential signal integration and amplification circuit achieves self balancing, after the switching to the integration stage, the charge $\Delta Q_s$ transferred by the sampling capacitor $C_s$ to the positive coefficient integration network and the negative coefficient balancing network is completely transferred to the balancing capacitor $C_{fn}$, rather than to the integration capacitor $C_{fp}$, and the output signal of the self-balancing differential signal integration and amplification circuit is stabilized to the state signal amplified by the K times; wherein $C_s$ represents the capacitance value of the sampling capacitor $C_s$, $C_{fn}$ represents the capacitance value of the balancing capacitor $C_{fn}$, $V_{com}$ represents a voltage output by the common-mode signal generation circuit to the common-mode signal terminal Com of the fully differential operational amplifier, $V_{inp}$ represents a voltage at the positive differential input terminal $V_{inp}$, $V_{inn}$ represents a voltage at the negative differential input terminal $V_{inn}$, $V_{Ip}$ represents a voltage at the positive input terminal Ip of the fully differential operational amplifier, and $V_{On}$ represents a voltage at the negative output terminal On of the fully differential operational amplifier.

* * * * *